United States Patent
Tripathi

(10) Patent No.: US 11,152,951 B2
(45) Date of Patent: Oct. 19, 2021

(54) QUAD SWITCHED MULTIBIT DIGITAL TO ANALOG CONVERTER AND CONTINUOUS TIME SIGMA-DELTA MODULATOR

(71) Applicant: STMicroelectronics International N.V., Geneva (CH)

(72) Inventor: Vivek Tripathi, Gautam Buddh Nagar (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

(21) Appl. No.: 17/099,423

(22) Filed: Nov. 16, 2020

(65) Prior Publication Data

US 2021/0184691 A1    Jun. 17, 2021

Related U.S. Application Data

(60) Provisional application No. 62/948,929, filed on Dec. 17, 2019.

(51) Int. Cl.
*H03M 1/66* (2006.01)
*H03M 1/74* (2006.01)
(Continued)

(52) U.S. Cl.
CPC ............ *H03M 1/747* (2013.01); *G06G 7/186* (2013.01); *H03F 3/45179* (2013.01);
(Continued)

(58) Field of Classification Search
CPC ...... H03M 1/0863; H03M 1/74; H03M 1/747; H03M 1/0682; H03M 1/66; H03M 1/745;
(Continued)

(56) References Cited

U.S. PATENT DOCUMENTS 5,283,580 A * 2/1994 Brooks ................ H03M 1/682
341/145
7,242,337 B2    7/2007 Uemori et al.
(Continued)

OTHER PUBLICATIONS

Breems, "A 2.2 GHz Continuous-Time ΔΣ ADC With-102 dBc THD and 25 MHz Bandwidth", IEEE Journal of Solid-State Circuits, vol. 51 , Issue: 12 , Dec. 2016.
(Continued)

*Primary Examiner* — Linh V Nguyen
(74) *Attorney, Agent, or Firm* — Crowe & Dunlevy

(57) ABSTRACT

A quad signal generator circuit generates four $2^N-1$ bit control signals in response to a sampling clock and a $2^N-1$ bit thermometer coded signal. A digital-to-analog converter (DAC) circuit has $2^N-1$ unit resistor elements, with each unit resistor element including four switching circuits controlled by corresponding bits of the four $2^N-1$ bit control signals. Outputs of the $2^N-1$ unit resistor elements are summed to generate an analog output signal. The quad signal generator circuit controls generation of the four $2^N-1$ bit control signals such that all logic states of bits of the four $2^N-1$ bit control signals remain constant for at least a duration of one cycle of the sampling clock. The analog output signal may be a feedback signal in a sigma-delta analog-to-digital converter (ADC) circuit that includes a multi-bit quantization circuit operating to quantize a filtered loop signal to generate the $2^N-1$ bit thermometer coded signal.

29 Claims, 6 Drawing Sheets

(51) Int. Cl.
H03M 1/76 (2006.01)
H03M 3/00 (2006.01)
G06G 7/186 (2006.01)
H03M 7/16 (2006.01)
H03F 3/45 (2006.01)

(52) U.S. Cl.
CPC .......... H03M 1/765 (2013.01); H03M 3/322 (2013.01); H03M 3/424 (2013.01); H03M 3/452 (2013.01); H03M 3/464 (2013.01); H03M 7/165 (2013.01)

(58) Field of Classification Search
CPC .. H03M 3/464; H03M 1/0678; H03M 1/1014; H03M 1/129; H03M 1/822; H03M 3/502; H03M 1/0604; H03M 1/0845; H03M 1/10; H03M 1/1023; H03M 1/1047; H03M 1/123; H03M 1/365; H03M 1/742; H03M 3/32; H03M 3/40; H03M 3/402; H03M 3/454; H03M 7/3053
USPC ................................. 341/143, 144, 151–154
See application file for complete search history.

(56) References Cited

U.S. PATENT DOCUMENTS

| | | | |
|---|---|---|---|
| 7,456,766 | B2 | 11/2008 | Keehr |
| 8,306,106 | B2 | 11/2012 | Alexander et al. |
| 8,319,674 | B2 | 11/2012 | Loeda et al. |
| 9,379,728 | B1 * | 6/2016 | Singh .................. H03M 1/1023 |
| 9,537,514 | B2 | 1/2017 | Talty et al. |
| 9,584,151 | B1 * | 2/2017 | Manganaro ......... H03M 1/0678 |
| 9,787,316 | B2 | 10/2017 | Shu |
| 10,148,277 | B1 | 12/2018 | Singh et al. |
| 10,790,842 | B1 * | 9/2020 | Paussa .................. H03M 1/069 |
| 10,965,302 | B1 * | 3/2021 | Zhao .................... H03M 1/0836 |
| 2004/0004511 | A1 * | 1/2004 | Kao .................... H03M 1/0678 327/536 |
| 2007/0188362 | A1 * | 8/2007 | Doerrer ................. H03M 3/338 341/143 |
| 2008/0309541 | A1 * | 12/2008 | Pelgrom ............. H03M 1/0673 341/159 |
| 2015/0061908 | A1 * | 3/2015 | Rajasekhar ......... H03M 1/0678 341/144 |
| 2015/0171878 | A1 * | 6/2015 | Schafferer ............... H03M 1/74 375/297 |
| 2020/0076446 | A1 * | 3/2020 | Egan ................... H03M 1/0863 |

OTHER PUBLICATIONS

Engel, "A 14b 3/6GHz current-steering RF DAC in 0.18μm CMOS with 66dB ACLR at 2.9GHz", 2012 IEEE International Solid-State Circuits Conference, pp. 2906-2916.

Park, Sungkyung, et al: "A Digital-to-Analog Converter Based on Differential-Quad Switching," IEEE Journal of Solid State Circuits, vol. 37, No. 10, Oct. 2002, pp. 1335-1338.

Sukimaran, Amrith, et al: "Design of Continuous-Time Modulators With Dual Switched-Capacitor Return-to-Zero DACs," IEEE Journal of Solid-State Circuits, vol. 51, No. 7, Jul. 2016, pp. 1619-1629.

Breems, Lucien, et al.: "A 2.2GHz Continuous-Time ΔΣ ADC with-102dBc THD and 25MHz BW," 2016 IEEE International Solid-State Circuits Conference (3 pages).

* cited by examiner

QUAD SWITCHED MULTIBIT DIGITAL TO ANALOG CONVERTER AND CONTINUOUS TIME SIGMA-DELTA MODULATOR

CROSS REFERENCE TO RELATED APPLICATIONS

This application claims priority from U.S. Provisional Application for Patent No. 62/948,929 filed Dec. 17, 2019, the disclosure of which is incorporated by reference.

TECHNICAL FIELD

The present invention generally relates to a digital-to-analog converter (DAC) circuit and, in particular, to a multibit DAC circuit for use in a continuous time (CT) sigma-delta (SD) modulator circuit.

BACKGROUND

FIG. 1 shows a time domain block diagram of a conventional continuous time (CT) sigma-delta (SD) analog-to-digital converter (ADC) circuit 10. The circuit 10 includes a continuous time sigma-delta modulator circuit 12 (illustrated here as a first-order circuit) having an input configured to receive an analog input signal A and an output configured to generate a digital output signal B comprised of a pulse density modulated pulse stream of 1-bit codes. The ratio formed by a count of the number of pulses in the pulse stream of the signal B divided by a total number of samples (set by a sampling clock at a sampling rate fs) of the input signal A over a known time interval represents the instantaneous magnitude of the input signal A. The circuit 10 further includes a decimator circuit 14 that accumulates and averages the pulses in the pulse stream of the digital output signal B to generate a digital signal C comprised of a stream of multi-bit (M-bit, where M>>1) digital words at an output word rate fd, where fd<<fs, set by a decimation factor.

The first order implementation of the sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 (a first order loop filter) to generate a change signal vc having a slope and magnitude that is dependent on the sign and magnitude of the analog difference signal vdif. A comparator circuit 24 samples the change signal vc in response to a sampling clock at the sampling rate fs and compares each sample of the change signal vc to a reference signal vref to generate a corresponding single bit pulse of the digital output signal B (where the single bit has a first logic state if vc>vref and has a second logic state if vc<vref). The comparator circuit 24 effectively operates as a single bit quantization circuit for quantizing the change signal vc. A single bit digital-to-analog converter (DAC) circuit 26 in the feedback loop then converts the logic state of the digital output signal B to a corresponding analog signal level for the analog feedback signal D.

It is possible to instead implement the sigma-delta modulator circuit 12 with a multi-bit quantization (for example, N bits, where 1<N<<M) as shown by FIG. 2. This circuit implementation requires a multi-bit (for example, N bit) quantization circuit 24' and a multi-bit DAC circuit 26' in the feedback loop. The quantization circuit 24' samples the change signal vc at the sampling rate fs set by the sampling clock CLK and generates a $2^N-1$ bit thermometer coded output word for each sample. The use of multi-bit quantization presents a number of advantages over the single-bit implementation of FIG. 1 including: permitting operation of the modulator to achieve a given resolution using a lower sampling rate fs; or permitting operation of the modulator to achieve a higher resolution for a given sampling rate fs. The DAC circuit 26' is a resistive circuit that includes $2^N-1$ unit resistive DAC elements (UE) that are respectively driven by the $2^N-1$ bits of the thermometer code word of the digital output signal B, with current outputs from the driven unit resistive DAC elements being summed at the DAC circuit output to generate an analog signal level for the analog feedback signal D. The decimator circuit 14 functions to low pass filter and down sample the $2^N-1$ bit thermometer code words in the stream of the digital output signal B to generate a digital signal C comprised of the stream of multi-bit (M-bit, the required resolution where M>>N) digital words at an output word rate fd set by a decimation factor.

A key characteristic of the sigma-delta modulator circuit 12 is its ability to push the quantization noise due to operation of the quantization circuit 24, 24' to higher frequencies away from the signal of interest. This is known in the art as noise shaping. The decimator circuit 14 can then be implemented with a low-pass filtering characteristic (i.e., frequency response) to substantially remove the high frequency components of the shaped quantization noise.

The use of multi-bit quantization in sigma-delta modulator circuits, however, is difficult because of the inherent mismatch present in the $2^N-1$ unit resistive DAC elements of the DAC circuit 26' in the feedback loop; this mismatch translating directly into non-linearity of the entire modulator 12. This non-linearity is due, for example, to the existence of unequal analog signal output steps (i.e., due to mismatch between the $2^N-1$ unit resistive DAC elements) of the multi-bit DAC circuit.

As a result of the non-linearity introduced in the analog output of the DAC circuit 26' due to the mismatch between unit resistive DAC elements, there will be an increase in the noise floor as well as increased harmonic distortion within the desired signal band with respect to the modulator output spectrum. The DAC non-linearity also modulates the quantization noise of the quantization circuit 24' into the signal band resulting in a degraded signal-to-noise ratio (SNR) and signal-to-noise and distortion ratio (SNDR).

With reference now to FIG. 3, it is known in the art to address the issue of DAC non-linearity by employing a circuit 102 in the feedback loop that implements a data weighted averaging (DWA) algorithm in order to achieve first order dynamic element matching (DEM) with respect to the $2^N-1$ unit resistive DAC elements. The circuit 102 receives the series of $2^N-1$ bit thermometer code words output from the quantization circuit 24' and generates a series of $2^N-1$ bit control words for actuating the $2^N-1$ unit resistive DAC elements of the DAC circuit 26' so that over time all of the $2^N-1$ unit resistive DAC elements will be relatively equally actuated in generating the analog feedback signal D.

The execution of the DWA algorithm introduces a processing delay into the signal processing loop that is in addition to the quantization delay. It is important that the total delay, referred to as the excess loop delay (ELD), not exceed one period Ts of the sampling clock CLK because this could lead to modulator instability. Indeed, it is preferred that the ELD satisfy the following constraint: 0.5

Ts<ELD<0.75 Ts. However, notwithstanding the benefits of calibrating the $2^N-1$ unit resistive DAC elements and with an acceptable ELD due to the DWA operation, the performance of the modulator 10' of FIG. 3 is unacceptable. This is attributed to concerns with one or more of the following: a) switching of the $2^N-1$ unit resistive DAC elements of the DAC circuit 26' at every edge of the sampling clock in response to the DWA algorithm; b) modification by the DWA algorithm of the number of transitions which introduces a drastic spectrum change; c) the presence of non-linear glitch energy (a dynamic non-linearity); and d) a drastic increase in harmonic distortion due to data dependent switching (in response to DWA) inter-symbol interference (ISI).

There is accordingly a need in the art to address the foregoing concern through implementation of an improved DAC circuit for use in the feedback path of a continuous time sigma-delta modulator.

SUMMARY

In an embodiment, a circuit comprises: a digital-to-analog converter (DAC) circuit having $2^N-1$ unit resistive DAC elements, wherein each unit resistive DAC element includes four switching circuits controlled by corresponding bits of four $2^N-1$ bit control signals, wherein outputs of the $2^N-1$ unit resistive DAC elements are summed to generate an analog output signal; and a quad signal generator circuit configured to generate the four $2^N-1$ bit control signals in response to a sampling clock and a $2^N-1$ bit thermometer coded input signal, wherein the quad signal generator circuit controls generation of the four $2^N-1$ bit control signals such that all logic states of bits of the four $2^N-1$ bit control signals remain constant for at least a duration of one cycle of the sampling clock.

In an embodiment, a sigma-delta analog-to-digital converter (ADC) circuit comprises: a summation circuit configured to receive an analog input signal and an analog feedback signal and generate a difference signal; a loop filter circuit configured to filter the difference signal and generate a change signal; a multi-bit quantization circuit configured to quantize the change signal and generate a $2^N-1$ bit thermometer coded signal; a quad signal generator circuit configured to generate four $2^N-1$ bit control signals in response to a sampling clock and the $2^N-1$ bit thermometer coded signal; a digital-to-analog converter (DAC) circuit having $2^N-1$ unit resistive DAC elements, wherein each unit resistive DAC element includes four switching circuits controlled by corresponding bits of the four $2^N-1$ bit control signals; wherein outputs of the $2^N-1$ unit resistive DAC elements are summed to generate the analog feedback signal; and wherein the quad signal generator circuit controls generation of the four $2^N-1$ bit control signals such that all logic states of bits of the four $2^N-1$ bit control signals remain constant for at least a duration of one cycle of the sampling clock.

In an embodiment, a sigma-delta analog-to-digital converter (ADC) circuit comprises: a loop filter configured to receive an analog input signal and an analog feedback signal and generate an integrated signal; a multi-bit quantization circuit configured to quantize the integrated signal and generate a $2^N-1$ bit thermometer coded signal; a quad signal generator circuit configured to generate four $2^N-1$ bit control signals in response to a sampling clock and the $2^N-1$ bit thermometer coded signal; a digital-to-analog converter (DAC) circuit having $2^N-1$ unit resistive DAC elements, wherein each unit resistive DAC element includes four switching circuits controlled by corresponding bits of the four $2^N-1$ bit control signals; wherein outputs of the $2^N-1$ unit resistive DAC elements are summed to generate the analog feedback signal; and wherein the quad signal generator circuit controls generation of the four $2^N-1$ bit control signals such that all logic states of bits of the four $2^N-1$ bit control signals remain constant for at least a duration of one cycle of the sampling clock.

BRIEF DESCRIPTION OF THE DRAWINGS

For a better understanding of the embodiments, reference will now be made by way of example only to the accompanying figures in which.

DETAILED DESCRIPTION

Figure 1:
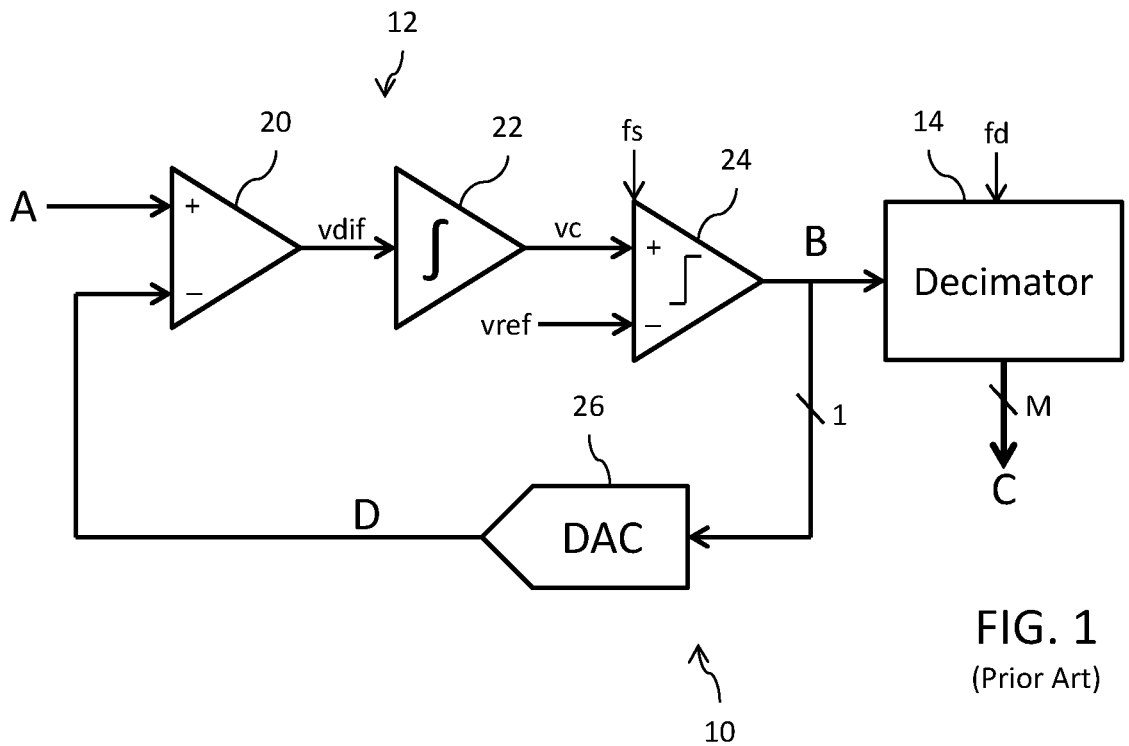
FIG. 1 is a time domain block diagram of a conventional sigma-delta analog-to-digital converter circuit with single bit quantization.
Figure 2:
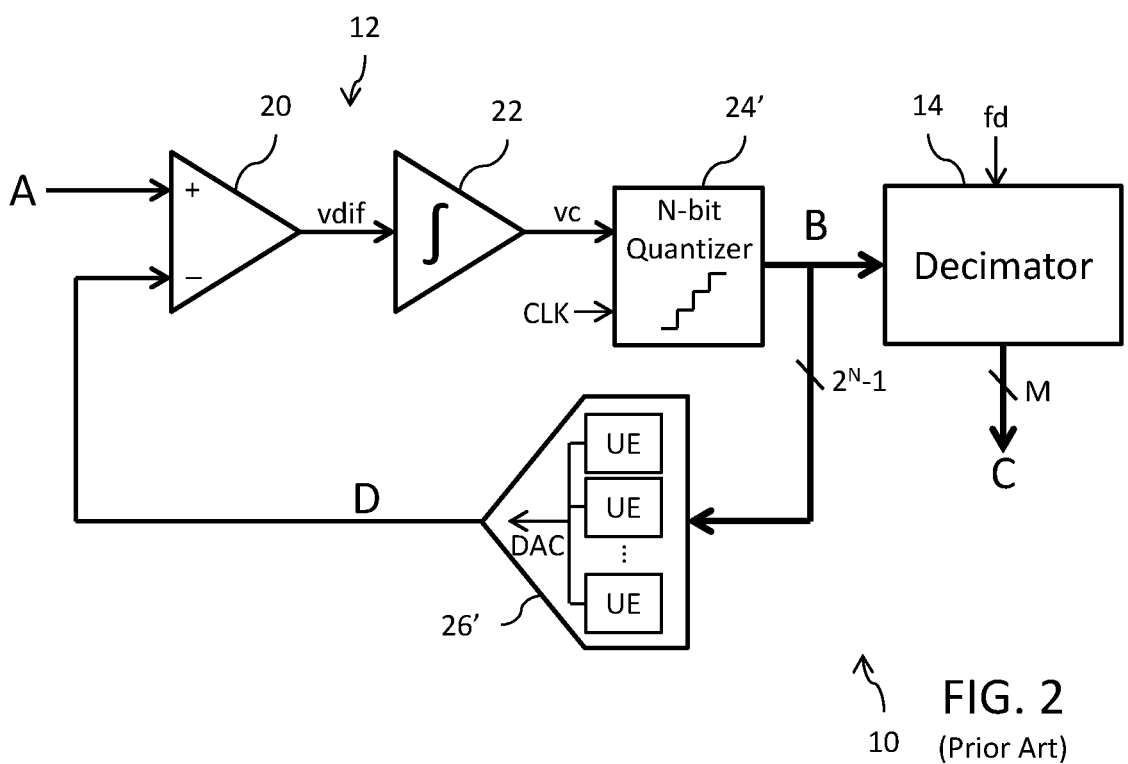
FIG. 2 is a time domain block diagram of a conventional sigma-delta analog-to-digital converter circuit with multi bit quantization.
Figure 3:
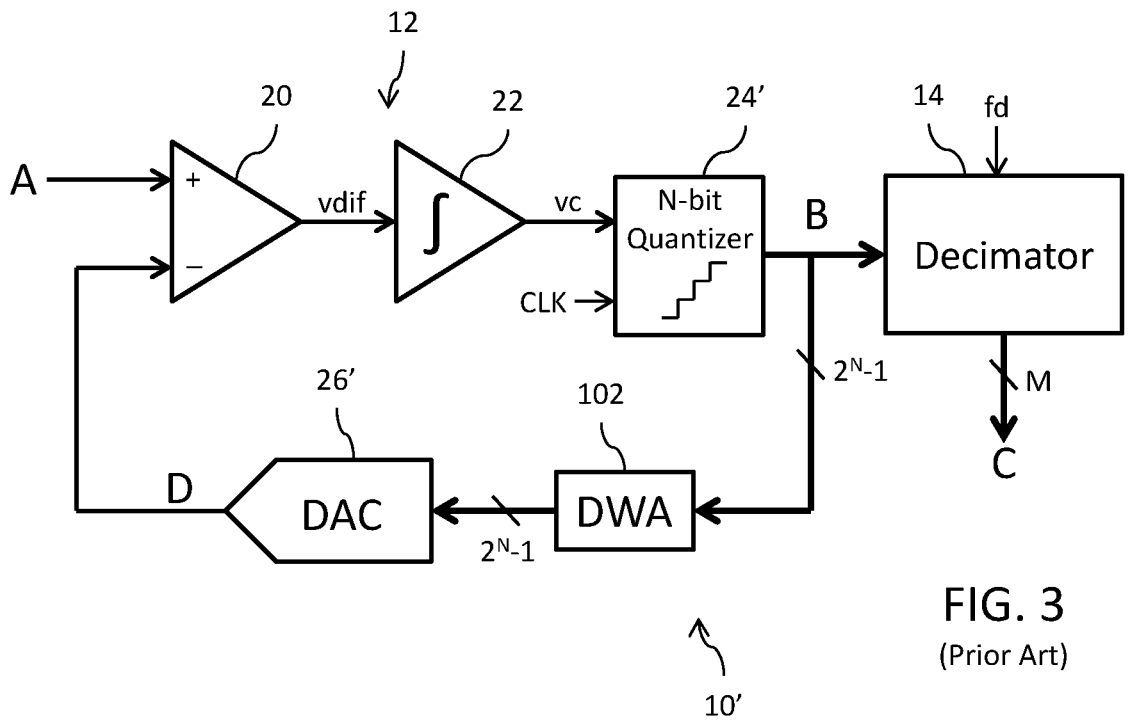
FIG. 3 is a time domain block diagram of a conventional sigma-delta analog-to-digital converter circuit with multi bit quantization and data weighted averaging.
Figure 4A:
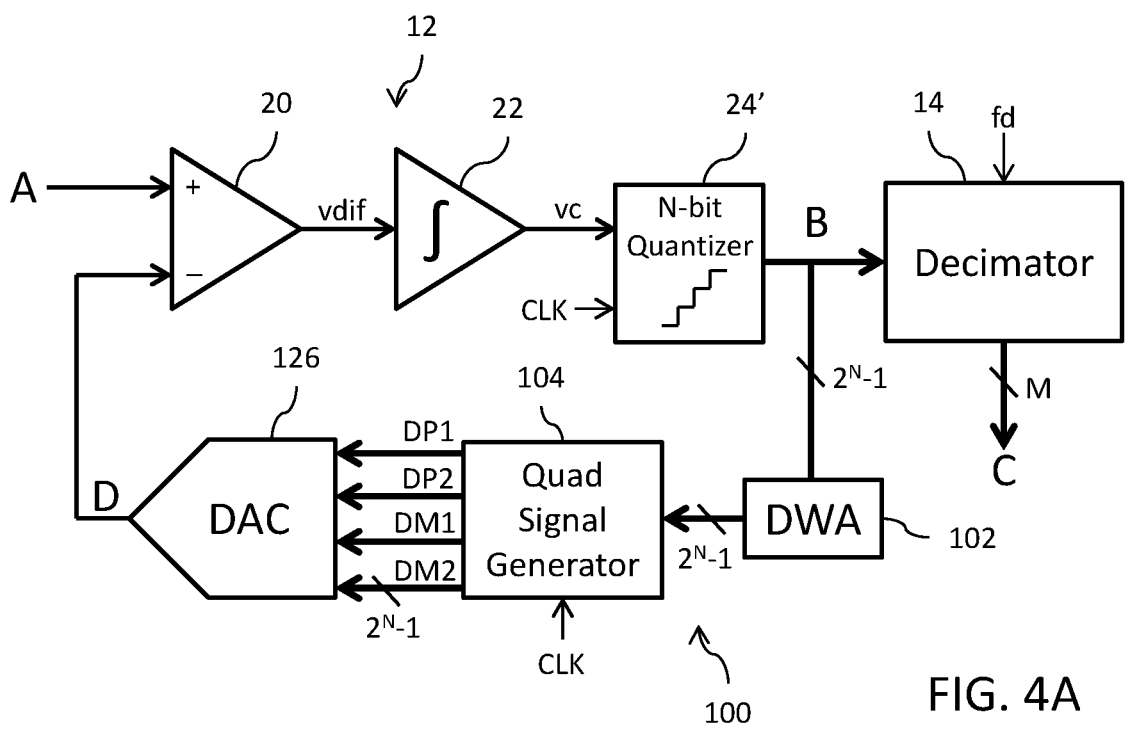
FIG. 4A is a time domain block diagram of a continuous time sigma-delta analog-to-digital converter circuit with a multi bit quantizer, data weighted averaging and a quad signal generator controlling a quad switched digital-to-analog converter.

Reference is now made to FIG. 4A which shows a time domain block diagram of a continuous time sigma-delta analog-to-digital converter (modulator) circuit 100 with a multi bit quantizer, data weighted averaging and a quad signal generator controlling a quad switched digital-to-analog converter. The circuit 100 includes a continuous time sigma-delta modulator circuit 12 (illustrated here as a first-order circuit, but it being understood that the loop filter of the modulator can of any order suited to the circuit application requirements; see, for example, FIG. 4B for a third-order continuous time sigma delta modulator circuit) having an input configured to receive an analog input signal A and an output configured to generate a digital output signal B comprised of a stream of multi-bit thermometer coded data words. The thermometer coded values in the pulse stream of the signal B at a sampling rate fs are processed in a decimator circuit 14 (comprising a low pass filter and down sampler) to generate an equivalent digital signal C of the input signal A with a required resolution and a required output word rate fd, where fd<<fs, set by a decimation factor.

The first order sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 (of the loop filter, here of first order type, without limitation) to generate a change signal vc having a slope and magnitude that is dependent on the sign and magnitude of the analog difference signal vdif. An N-bit quantization circuit 24' samples the change signal vc in response to a clock CLK at the sampling rate fs and generates the digital output signal B as a $2^N-1$ bit thermometer coded output word for each sample. The use of multi-bit quantization presents a number of advantages including: permitting operation of the modulator to achieve a given resolution using a lower sampling rate fs; or permitting operation of the modulator to achieve a higher resolution for a given sampling rate fs. A circuit 102 that implements a data weighted averaging (DWA) algorithm receives the $2^N-1$ bit thermometer coded output word and outputs a $2^N-1$ bit output DWA word providing for first order dynamic element matching (DEM). A quad signal generator circuit 104 receives the $2^N-1$ bit output DWA word and the sampling clock CLK and generates four $2^N-1$ bit control words DP1, DP2, DM1 and DM2 whose data values change at the same rate as the rate of the sampling clock CLK. A DAC circuit 126 includes $2^N-1$ unit resistive DAC elements that are respectively driven by corresponding bits of the $2^N-1$ bits of the control words DP1, DP2, DM1 and DM2 to generate currents which are summed at the output of the DAC circuit to produce an analog signal for the analog feedback signal D. The decimator circuit 14 low pass filters and down samples the $2^N-1$ bit code words in the stream of the digital output signal B to generate a digital signal C comprised of the stream of multi-bit (M-bit, the required resolution, where M>>N) digital words at an output word rate fd set by a decimation factor.

Figure 4B:
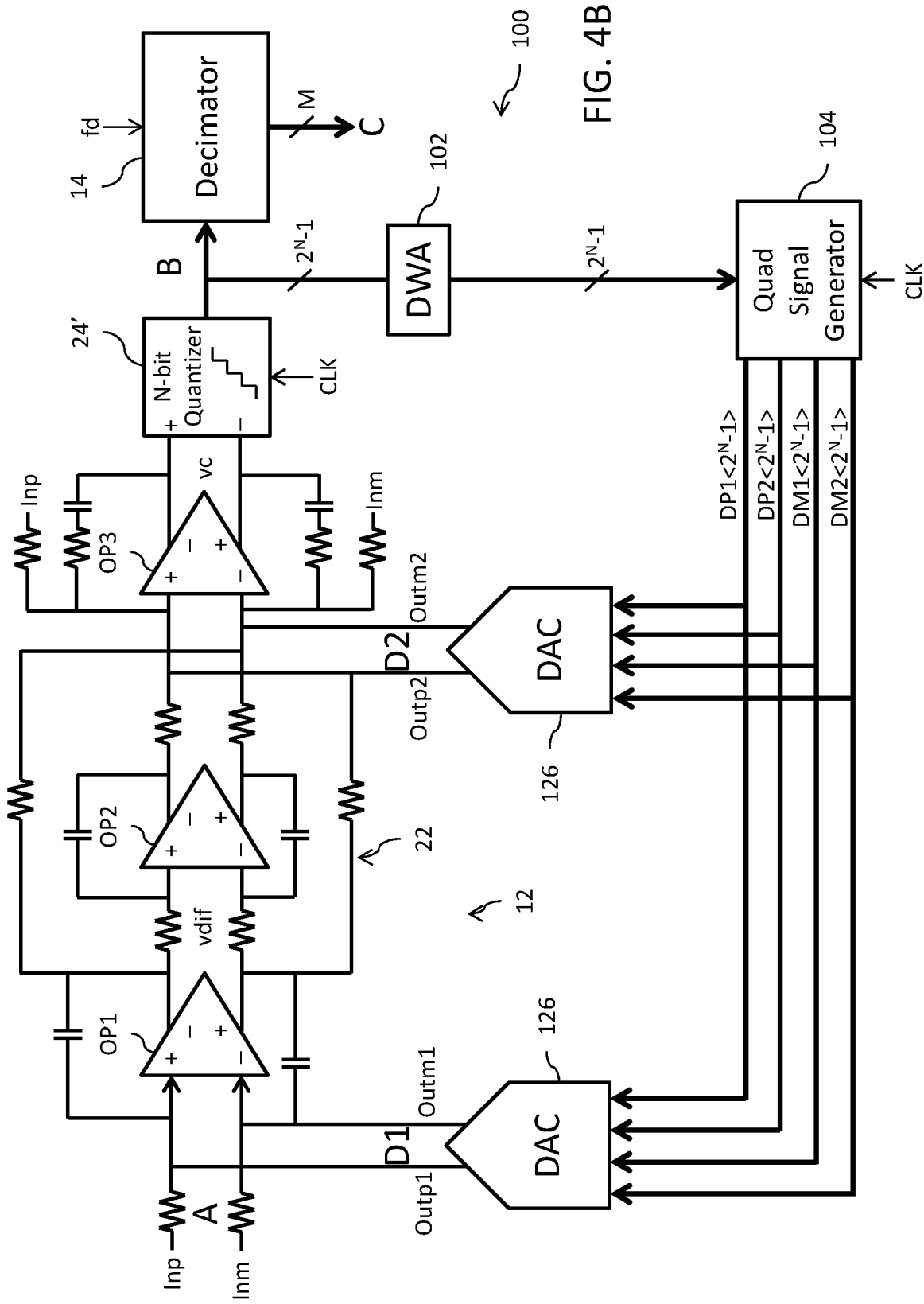
FIG. 4B illustrates in more detail a differential signal implementation of the circuit of FIG. 4A for a third-order continuous time sigma delta analog-to-digital converter.

The implementation illustrated in FIG. 4A is a simplification. In a preferred implementation, the circuit is fully differential and includes a higher order sigma-delta modulator. FIG. 4B shows a circuit diagram for a differential signal implementation of the circuit of FIG. 4A using a third-order modulator. The loop filter is formed by operational amplifiers OP1, OP2 and OP3 to provide the difference amplifier 20 and integrator circuit 22 for the third-order implementation of the sigma-delta modulator circuit 12 in a configuration with cascaded integrators having feed forward as well as feedback (CIFF-FB). Because of the choice for a third-order implementation with CIFF-FB, two DACs 126 are needed. Each DAC 126 receives the $2^N-1$ bits of the control words DP1, DP2, DM1 and DM2 output from the quad signal generator circuit 104 and provides the differential output signal D (Outm and Outp). The operational amplifier OP1 receives the signals A (Inm and Inp) and D1 (Outm1 and Outp1 from one of the DACs) as differential signals. The operational amplifier OP3 receives the signal D2 (Outm2 and Outp2 from the other of the DACs) as a differential signal in combination with the differential signal output from the operational amplifier OP2 and the differential input signal A (Inp and Inm). The quantization circuit 24' receives the signal vc output from the integrator circuit 22 as a differential signal.

Figure 5:
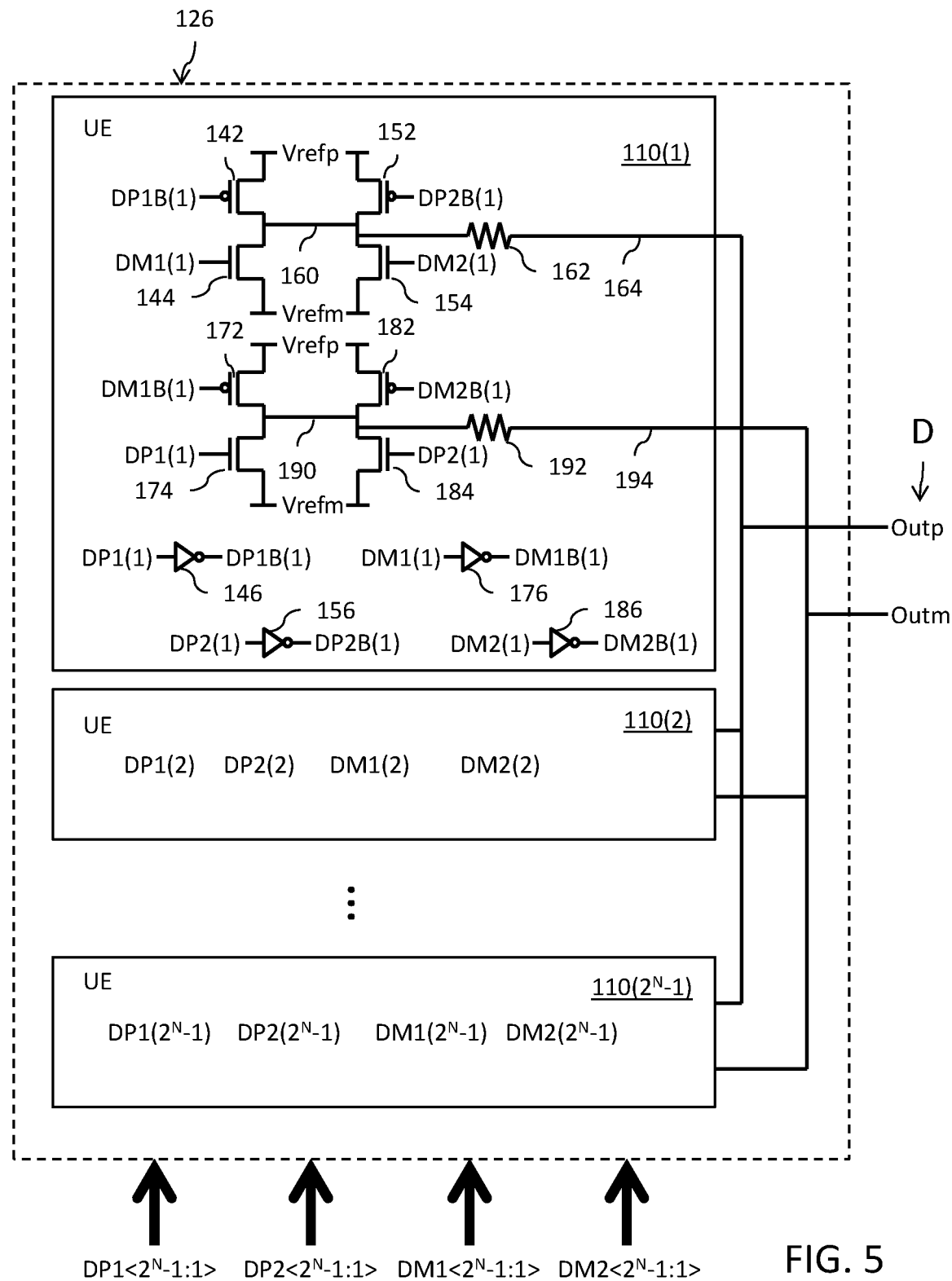
FIG. 5 is a block diagram of a digital-to-analog converter (DAC) circuit as used in the circuit of FIG. 4B.

Reference is now made to FIG. 5 which shows a block diagram of the DAC circuit 126. The DAC circuit 126 includes $2^N-1$ unit resistive DAC elements (UE) 110(1)-110($2^N-1$) that are selectively actuated in response to the control word output of the quad signal generator circuit 104 to generate the analog feedback signal. Each unit resistive DAC element 110 receives the corresponding bit from each of the control words DP1<$2^N-1$:1>, DP2<$2^N-1$:1>, DM1<$2^N-1$:1> and DM2<$2^N-1$:1>. For example, unit resistive DAC element 110(1) receives the first bits DP1(1), DP2(1), DM1(1) and DM2(1), unit resistive DAC element 110(2) receives the second bits DP1(2), DP2(2), DM1(2) and DM2(2), . . . , and the unit resistive DAC element 110($2^N-1$) receives the $2^N-1$ th bits DP1($2^N-1$), DP2($2^N-1$), DM1($2^N-1$) and DM2($2^N-1$). The quad signal generator circuit 104 generates the bits of the control words DP1<$2^N-1$:1>, DP2<$2^N-1$:1>, DM1<$2^N-1$:1> and DM2<$2^N-1$:1> from the $2^N-1$ bit output DWA word in a manner to be described in detail herein. The bits of the control words DP1<$2^N-1$:1>, DP2<$2^N-1$:1>, DM1<$2^N-1$:1> and DM2<$2^N-1$:1> change at the same rate as the rate of the sampling clock CLK.

For each given one X, where X is from 1 to $2^N-1$, the unit resistive DAC element 110(X) includes a first CMOS inverter (switching) circuit formed by a pMOS transistor 142 and an nMOS transistor 144 whose source-drain paths are coupled in series between a first reference voltage Vrefp and a second reference voltage Vrefm. The switching circuit switches between the first and second reference voltages in response to certain ones of the control words where: the gate of the pMOS transistor 142 receives the bit DP1B(X) which is the logical inversion (generated by inverter 146) of the bit DP1(X) of the control word DP1<$2^N-1$:1>. The gate of the nMOS transistor 144 receives the bit DM1(X) of the control word DM1<$2^N-1$:1>. The unit resistive DAC element 110(X) also includes a second CMOS inverter (switching) circuit formed by a pMOS transistor 152 and an nMOS transistor 154 whose source-drain paths are coupled in series between the first reference voltage Vrefp and the second reference voltage Vrefm. The switching circuit switches between the first and second reference voltages in response to certain ones of the control words where: the gate of the pMOS transistor 152 receives the bit DP2B(X) (generated by inverter 156) which is the logical inversion of the bit DP2(X) of the control word DP2<$2^N-1$:1>. The gate of the nMOS transistor 124 receives the bit DM2(X) of the control word DM2<$2^N-1$:1>. The common drain terminals of the transistors 142 and 144 are connected to the common drain terminals of transistors 152 and 154 at node 160. A resistor 162 is coupled between the node 160 and a first output node 164 of the unit resistive DAC element 110(X) to produce an output current signal.

The unit resistive DAC element 110(X) further includes a third CMOS inverter (switching) circuit formed by a pMOS transistor 172 and an nMOS transistor 174 whose source-drain paths are coupled in series between the first reference voltage Vrefp and the second reference voltage Vrefm. The switching circuit switches between the first and second reference voltages in response to certain ones of the control words where: the gate of the pMOS transistor 172 receives the bit DM1B(X) (generated by inverter 176) which is the logical inversion of the bit DM1(X) of the control word DM1<$2^N-1$:1>. The gate of the nMOS transistor 174 receives the bit DP1(X) of the control word DP1<$2^N-1$:1>. The unit resistive DAC element 110(X) also includes a fourth CMOS inverter (switching) circuit formed by a pMOS transistor 182 and an nMOS transistor 184 whose source-drain paths are coupled in series between the first reference voltage Vrefp and the second reference voltage Vrefm. The switching circuit switches between the first and second reference voltages in response to certain ones of the control words where: the gate of the pMOS transistor 182 receives the bit DM2B(X) (generated by inverter 186) which is the logical inversion of the bit DM2(X) of the control word DM2<$2^N-1$:1>. The gate of the nMOS transistor 184 receives the bit DP2(X) of the control word DP2<$2^N$–1:1>. The common drain terminals of the transistors 172 and 174 are connected to the common drain terminals of transistors 182 and 184 at node 190. A resistor 192 is coupled between the node 190 and a second output node 194 of the Unit resistive DAC element 110(X) to produce a current output signal.

The first reference voltage Vrefp and the second reference voltage Vrefm are selected by the circuit designer based on the design voltages for the circuit. In an embodiment, for example, the first reference voltage Vrefp=1.1V and the second reference voltage Vrefm=0V. Any suitable regulator voltage generator circuit can be used to provide first reference voltage Vrefp and the second reference voltage Vrefm.

The current output signals generated at the first output nodes 164 of the unit resistive DAC elements 110(1)-110($2^N$–1) are connected together at a summing node to generate a net output DAC current providing a first component Outp of the analog feedback signal D. The current output signals at the second output nodes 194 of the unit resistive DAC elements 110(1)-110($2^N$–1) are connected together at a summing node to generate a net output DAC current providing a second component Outm of the analog feedback signal D. In this implementation, the analog feedback signal D is a differential current signal formed by the Outp and Outm components. The Outp and Outm components are input to the amplifier OP input terminals.

It will be noted that although the circuit 10 is preferably implemented in differential form, it is possible to implement the circuit in single ended form.

Figure 6:
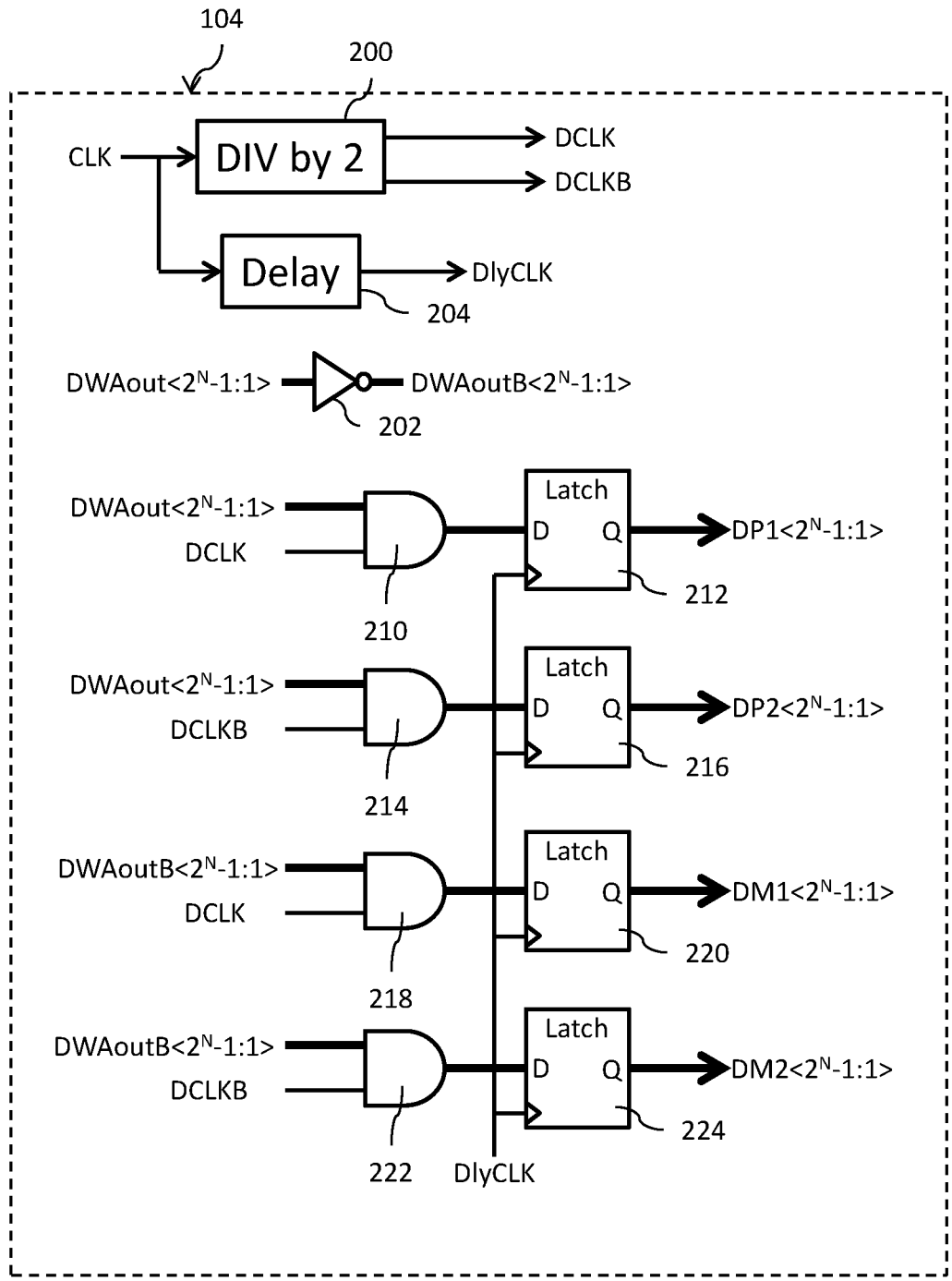
FIG. 6 is a block diagram of a the quad signal generator circuit as used in the circuit of FIG. 4B.

Reference is now made to FIG. 6 which shows a block diagram of the quad signal generator circuit 104. The sampling clock CLK input to the quad signal generator circuit 104 is frequency divided by 2 using a frequency divider circuit 200 to output a divided by 2 clock (DCLK) and a logical inverse (i.e., 180° out of phase) divided by 2 clock (DCLKB). The $2^N$–1 bit output DWA word (DWAout<$2^N$–1:1>) received from the DWA circuit 102 is logically inverted by circuit 202 to generate an inverted $2^N$–1 bit output DWA word (DWAoutB<$2^N$–1:1>). A logic delay circuit 204 receives the sampling clock CLK and outputs a phase delayed sampling clock DlyCLK. The quad control words DP1<$2^N$–1:1>, DP2<$2^N$–1:1>, DM1<$2^N$–1:1> and DM2<$2^N$–1:1> are generated by logically combining the DWAout<$2^N$–1:1> word, DWAoutB<$2^N$–1:1> word, DCLK clock and DCLKB clock as follows. The control word DP1<$2^N$–1:1> is generated by logically ANDing 210 the DWAout<$2^N$–1:1> word with the DCLK clock, and then latching the result of the logical ANDing operation in a latch circuit 212 in response to the DlyCLK clock. The control word DP2<$2^N$–1:1> is generated by logically ANDing 214 the DWAout<$2^N$–1:1> word with the DCLKB clock, and then latching the result of the logical ANDing operation in a latch circuit 216 in response to the DlyCLK clock. The control word DM1<$2^N$–1:1> is generated by logically ANDing 218 the DWAoutB<$2^N$–1:1> word with the DCLK clock, and then latching the result of the logical ANDing operation in a latch circuit 220 in response to the DlyCLK clock. The control word DM2<$2^N$–1:1> is generated by logically ANDing 222 the DWAoutB<$2^N$–1:1> word with the DCLKB clock, and then latching the result of the logical ANDing operation in a latch circuit 224 in response to the DlyCLK clock.

Figure 7:
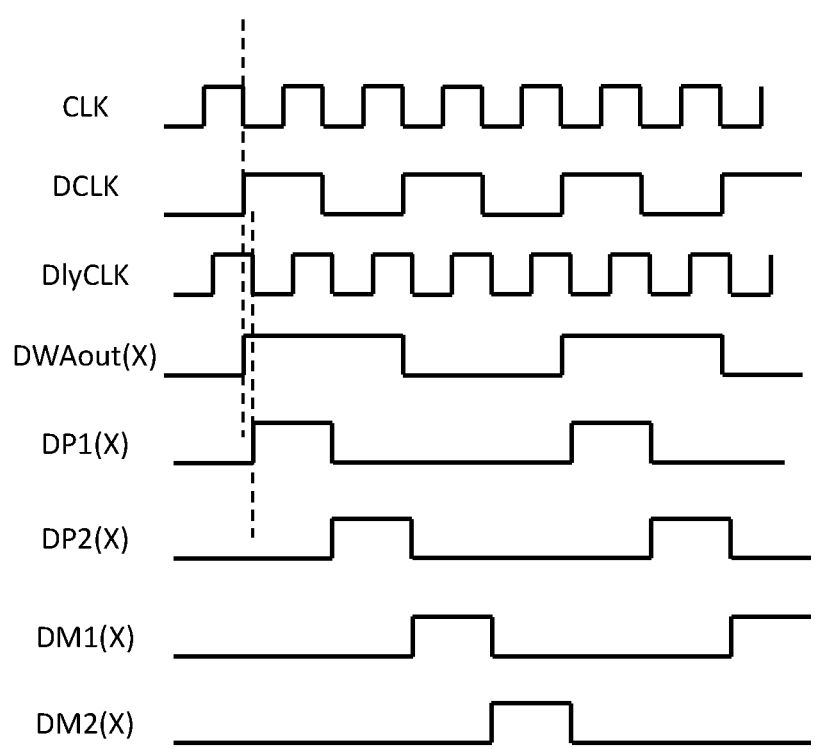
FIG. 7 shows a timing diagram for operation of the quad signal generator circuit.

FIG. 7 shows a timing diagram for operation of the quad signal generator circuit 104. It will be noted that changes in logic state of the control signals DP1(X), DP2(X), DM1(X) and DM2(X) occur in response to the same edge (in this case, the trailing edge) of the sampling clock CLK. Thus, changes in the logic state of the control signals DP1(X), DP2(X), DM1(X) and DM2(X) occur at a same rate as the rate of the sampling clock CLK. In other words, the logic state of the control signals DP1(X), DP2(X), DM1(X) and DM2(X) remains constant for a duration of time that is at least as long as the duration of one cycle of the sampling clock CLK. This operation occurs because the DCLK clock and DCLKB clock, at one-half the rate of the sampling clock CLK, are controlling the logical combination function through the ANDing operation which generates the control signals DP1(X), DP2(X), DM1(X) and DM2(X) from the DWAout(X) and DWAoutB(X) bits.

Although disclosed herein in the context of a continuous time delta sigma modulator, it will be understood that the disclosed circuit and operation herein is also applicable to discrete time modulators.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A circuit, comprising:
   a digital-to-analog converter (DAC) circuit having $2^N$–1 unit resistive DAC elements, wherein each unit resistive DAC element includes four switching circuits controlled by corresponding bits of four $2^N$–1 bit control signals, wherein outputs of the $2^N$–1 unit resistive DAC elements are summed to generate an analog output signal; and
   a quad signal generator circuit configured to generate the four $2^N$–1 bit control signals in response to a sampling clock and a $2^N$–1 bit thermometer coded input signal, wherein the quad signal generator circuit controls generation of the four $2^N$–1 bit control signals such that all logic states of bits of the four $2^N$–1 bit control signals remain constant for at least a duration of one cycle of the sampling clock.

2. The circuit of claim 1, wherein the quad signal generator circuit controls generation of the four $2^N$–1 bit control signals such that all changes in logic state of bits of the four $2^N$–1 bit control signals occur in response to a same leading or trailing edge of the cycles of the sampling clock.

3. The circuit of claim 1, wherein the quad signal generator circuit includes a frequency divider circuit configured to divide the sampling clock and generate a divided sampling clock, and wherein the quad signal generator circuit controls generation of the four $2^N$–1 bit control signals such that all changes in logic states of bits of the four $2^N$–1 bit control signals occur in response to edges of the divided sampling clock.

4. The circuit of claim 1, wherein four switching circuits of each unit resistive DAC element comprise:
   a first switching circuit configured to switch a first common node between a first and second reference voltages in response to a first control signal of the four $2^N$–1 bit control signals and a logical inversion of a second control signal of the four $2^N$–1 bit control signals;
   a second switching circuit configured to switch the first common node between the first and second reference voltages in response to a third control signal of the four $2^N-1$ bit control signals and a logical inversion of a fourth control signal of the four $2^N-1$ bit control signals;

a third switching circuit configured to switch a second common node between the first and second reference voltages in response to the second control signal of the four $2^N-1$ bit control signals and a logical inversion of the first control signal of the four $2^N-1$ bit control signals; and a fourth switching circuit configured to switch the second common node between the first and second reference voltages in response to the fourth control signal of the four $2^N-1$ bit control signals and a logical inversion of the third control signal of the four $2^N-1$ bit control signals.

5. The circuit of claim 4, further comprising:

a first resistive circuit coupled between the first common node and a first summing output node for providing a first component of the analog output signal; and a second resistive circuit coupled between the second common node and a second summing output node for providing a second component of the analog output signal.

6. The circuit of claim 5, wherein the first and second components are differential currents of the analog output signal.

7. The circuit of claim 4, wherein the quad signal generator circuit comprises:

a frequency divider circuit configured to divide the sampling clock and generate a divided sampling clock;

a first logic circuit configured to logically combine each bit of the $2^N-1$ bit thermometer coded input signal with the divided sampling clock to generate a corresponding bit of the second control signal;

a second logic circuit configured to logically combine each bit of the $2^N-1$ bit thermometer coded input signal with a logical inverse of the divided sampling clock to generate a corresponding bit of the fourth control signal;

a third logic circuit configured to logically combine each bit of a logical inverse of the $2^N-1$ bit thermometer coded input signal with the divided sampling clock to generate a corresponding bit of the first control signal; and a fourth logic circuit configured to logically combine each bit of the logical inverse of the $2^N-1$ bit thermometer coded input signal with the logical inverse of the divided sampling clock to generate a corresponding bit of the third control signal.

8. The circuit of claim 7, wherein the quad signal generator circuit further comprises a latching circuit for each of the four $2^N-1$ bit control signals that is configured to latch the bits of the four $2^N-1$ bit control signals in response to a delayed sampling clock generated by applying a delay to the sampling clock.

9. The circuit of claim 1, wherein the $2^N-1$ bit thermometer coded input signal is generated with data weighted averaging (DWA).

10. The circuit of claim 9, further including a DWA circuit configured to apply data weighted averaging to a received $2^N-1$ bit thermometer coded signal in order to generate the $2^N-1$ bit thermometer coded input signal.

11. The circuit of claim 10, further including a multi-bit quantization circuit configured to generate the $2^N-1$ bit thermometer coded signal.

12. A sigma-delta analog-to-digital converter (ADC) circuit, comprising:

a loop filter circuit configured to generate a difference signal from a difference of an analog input signal and an analog feedback signal and filter the difference signal to generate a change signal;

a multi-bit quantization circuit configured to quantize the change signal and generate a $2^N-1$ bit thermometer coded signal;

a quad signal generator circuit configured to generate four $2^N-1$ bit control signals in response to a sampling clock and the $2^N-1$ bit thermometer coded signal;

a digital-to-analog converter (DAC) circuit having $2^N-1$ unit resistive DAC elements, wherein each unit resistive DAC element includes four switching circuits controlled by corresponding bits of the four $2^N-1$ bit control signals;

wherein outputs of the $2^N-1$ unit resistive DAC elements are summed to generate the analog feedback signal; and wherein the quad signal generator circuit controls generation of the four $2^N-1$ bit control signals such that all logic states of bits of the four $2^N-1$ bit control signals remain constant for at least a duration of one cycle of the sampling clock.

13. The circuit of claim 12, wherein the $2^N-1$ bit thermometer coded signal is generated with data weighted averaging (DWA).

14. The circuit of claim 13, further including a DWA circuit configured to apply data weighted averaging to a $2^N-1$ bit thermometer coded output signal from the multi-bit quantization circuit in order to generate the $2^N-1$ bit thermometer coded signal.

15. The circuit of claim 12, wherein the quad signal generator circuit controls generation of the four $2^N-1$ bit control signals such that all changes in logic state of bits of the four $2^N-1$ bit control signals occur in response to a same leading or trailing edge of the cycles of the sampling clock.

16. The circuit of claim 12, wherein the quad signal generator circuit includes a frequency divider circuit configured to divide the sampling clock and generate a divided sampling clock, and wherein the quad signal generator circuit controls generation of the four $2^N-1$ bit control signals such that all changes in logic states of bits of the four $2^N-1$ bit control signals occur in response to edges of the divided sampling clock.

17. The circuit of claim 12, wherein four switching circuits of each unit resistive DAC element comprise:

a first switching circuit configured to switch a first common node between a first and second reference voltages in response to a first control signal of the four $2^N-1$ bit control signals and a logical inversion of a second control signal of the four $2^N-1$ bit control signals;

a second switching circuit configured to switch the first common node between the first and second reference voltages in response to a third control signal of the four $2^N-1$ bit control signals and a logical inversion of a fourth control signal of the four $2^N-1$ bit control signals;

a third switching circuit configured to switch a second common node between the first and second reference voltages in response to the second control signal of the four $2^N-1$ bit control signals and a logical inversion of the first control signal of the four $2^N-1$ bit control signals; and a fourth switching circuit configured to switch the second common node between the first and second reference voltages in response to the fourth control signal of the four $2^N-1$ bit control signals and a logical inversion of the third control signal of the four $2^N-1$ bit control signals.

18. The circuit of claim 17, further comprising:
a first resistive circuit coupled between the first common node and a first summing output node for providing a first component of the analog output signal; and
a second resistive circuit coupled between the second common node and a second summing output node for providing a second component of the analog output signal.

19. The circuit of claim 18, wherein the first and second components are differential currents of the analog output signal.

20. The circuit of claim 17, wherein the quad signal generator circuit comprises:
a frequency divider circuit configured to divide the sampling clock and generate a divided sampling clock;
a first logic circuit configured to logically combine each bit of the $2^N-1$ bit thermometer coded signal with the divided sampling clock to generate a corresponding bit of the second control signal;
a second logic circuit configured to logically combine each bit of the $2^N-1$ bit thermometer coded signal with a logical inverse of the divided sampling clock to generate a corresponding bit of the fourth control signal;
a third logic circuit configured to logically combine each bit of a logical inverse of the $2^N-1$ bit thermometer coded signal with the divided sampling clock to generate a corresponding bit of the first control signal; and
a fourth logic circuit configured to logically combine each bit of the logical inverse of the $2^N-1$ bit thermometer coded signal with the logical inverse of the divided sampling clock to generate a corresponding bit of the third control signal.

21. The circuit of claim 20, wherein the quad signal generator circuit further comprises a latching circuit for each of the four $2^N-1$ bit control signals that is configured to latch the bits of the four $2^N-1$ bit control signals in response to a delayed sampling clock generated by applying a delay to the sampling clock.

22. A sigma-delta analog-to-digital converter (ADC) circuit, comprising:
a loop filter configured to receive an analog input signal and a first analog feedback signal and generate an integrated signal;
a multi-bit quantization circuit configured to quantize the integrated signal and generate a $2^N-1$ bit thermometer coded signal;
a quad signal generator circuit configured to generate four $2^N-1$ bit control signals in response to a sampling clock and the $2^N-1$ bit thermometer coded signal;
a first digital-to-analog converter (DAC) circuit having $2^N-1$ unit resistive DAC elements, wherein each unit resistive DAC element includes four switching circuits controlled by corresponding bits of the four $2^N-1$ bit control signals;
wherein outputs of the $2^N-1$ unit resistive DAC elements of the first DAC circuit are summed to generate the first analog feedback signal; and
wherein the quad signal generator circuit controls generation of the four $2^N-1$ bit control signals such that all logic states of bits of the four $2^N-1$ bit control signals remain constant for at least a duration of one cycle of the sampling clock.

23. The circuit of claim 22, wherein the loop filter is at least third order and further receives a second analog feedback signal to generate the integrated signal, and further comprising:
a second digital-to-analog converter (DAC) circuit having $2^N-1$ unit resistive DAC elements, wherein each unit resistive DAC element includes four switching circuits controlled by corresponding bits of the four $2^N-1$ bit control signals; and
wherein outputs of the $2^N-1$ unit resistive DAC elements of the second DAC circuit are summed to generate the second analog feedback signal.

24. The circuit of claim 22, further including a data weighted averaging (DWA) circuit configured to apply data weighted averaging to a $2^N-1$ bit thermometer coded output signal from the multi-bit quantization circuit in order to generate the $2^N-1$ bit thermometer coded signal.

25. The circuit of claim 22, wherein four switching circuits of each unit resistive DAC element comprise:
a first switching circuit configured to switch a first common node between a first and second reference voltages in response to a first control signal of the four $2^N-1$ bit control signals and a logical inversion of a second control signal of the four $2^N-1$ bit control signals;
a second switching circuit configured to switch the first common node between the first and second reference voltages in response to a third control signal of the four $2^N-1$ bit control signals and a logical inversion of a fourth control signal of the four $2^N-1$ bit control signals;
a third switching circuit configured to switch a second common node between the first and second reference voltages in response to the second control signal of the four $2^N-1$ bit control signals and a logical inversion of the first control signal of the four $2^N-1$ bit control signals; and
a fourth switching circuit configured to switch the second common node between the first and second reference voltages in response to the fourth control signal of the four $2^N-1$ bit control signals and a logical inversion of the third control signal of the four $2^N-1$ bit control signals.

26. The circuit of claim 25, further comprising:
a first resistive circuit coupled between the first common node and a first summing output node for providing a first component of the analog output signal; and
a second resistive circuit coupled between the second common node and a second summing output node for providing a second component of the analog output signal.

27. The circuit of claim 26, wherein the first and second components are differential currents of the analog output signal.

28. The circuit of claim 25, wherein the quad signal generator circuit comprises:
a frequency divider circuit configured to divide the sampling clock and generate a divided sampling clock;
a first logic circuit configured to logically combine each bit of the $2^N-1$ bit thermometer coded signal with the divided sampling clock to generate a corresponding bit of the second control signal;
a second logic circuit configured to logically combine each bit of the $2^N-1$ bit thermometer coded signal with a logical inverse of the divided sampling clock to generate a corresponding bit of the fourth control signal;

a third logic circuit configured to logically combine each bit of a logical inverse of the $2^N-1$ bit thermometer coded signal with the divided sampling clock to generate a corresponding bit of the first control signal; and a fourth logic circuit configured to logically combine each bit of the logical inverse of the $2^N-1$ bit thermometer coded signal with the logical inverse of the divided sampling clock to generate a corresponding bit of the third control signal.

29. The circuit of claim 28, wherein the quad signal generator circuit further comprises a latching circuit for each of the four $2^N-1$ bit control signals that is configured to latch the bits of the four $2^N-1$ bit control signals in response to a delayed sampling clock generated by applying a delay to the sampling clock.

* * * * *